(12) United States Patent
Na et al.

(10) Patent No.: US 11,502,157 B2
(45) Date of Patent: Nov. 15, 2022

(54) DISPLAY PANEL

(71) Applicant: Samsung Display Co., Ltd., Yongin-si (KR)

(72) Inventors: Jisu Na, Yongin-si (KR); Yangwan Kim, Yongin-si (KR); Minwoo Byun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/087,480

(22) Filed: Nov. 2, 2020

(65) Prior Publication Data
US 2021/0050405 A1    Feb. 18, 2021

Related U.S. Application Data

(63) Continuation of application No. 16/779,303, filed on Jan. 31, 2020, now Pat. No. 10,825,886.

(30) Foreign Application Priority Data

Mar. 8, 2019  (KR) .................. 10-2019-0027015

(51) Int. Cl.
*H01L 27/32*   (2006.01)
*H01L 51/52*   (2006.01)

(52) U.S. Cl.
CPC ........ *H01L 27/3276* (2013.01); *H01L 27/323* (2013.01); *H01L 27/3223* (2013.01);
(Continued)

(58) Field of Classification Search
CPC ............. H01L 27/3223; H01L 27/3227; H01L 27/323; H01L 27/3232; H01L 27/3234; H01L 27/3276; H01L 51/52
(Continued)

(56) References Cited

U.S. PATENT DOCUMENTS 10,186,191 B2   1/2019 Kang et al.
10,229,964 B2   3/2019 Kim et al.
(Continued)

FOREIGN PATENT DOCUMENTS

CN   102789755 A   11/2012
CN   107705756 A   2/2018
(Continued)

OTHER PUBLICATIONS

Extended European Search Report for corresponding European Patent Application No. 20160829.6, dated Aug. 3, 2020, 18 pages.

*Primary Examiner* — Matthew E Warren
(74) *Attorney, Agent, or Firm* — Lewis Roca Rothgerber Christie LLP

(57) ABSTRACT

A display panel includes: a substrate including: a first region; a second region; a non-display area surrounding the first region and the second region; and a display area surrounding the non-display area; a plurality of pixels in the display area; a plurality of wirings configured to supply signals to the plurality of pixels; a load matching area connected to first wirings of the wirings, the load matching area including load units in the non-display area; and a dummy area including a plurality of dummy units spaced apart from the load units in the non-display area, wherein each of the load units comprises a load semiconductor layer, a first load conductive layer, and a second load conductive layer which at least partially overlap each other with an insulating layer therebetween, and the load semiconductor layer is connected to the second load conductive layer via a first contact hole.

22 Claims, 14 Drawing Sheets

(52) U.S. Cl.
CPC ...... *H01L 27/3227* (2013.01); *H01L 27/3232* (2013.01); *H01L 27/3234* (2013.01); *H01L 51/52* (2013.01)

(58) Field of Classification Search
USPC ........................................ 257/40, 72, 80, 88
See application file for complete search history.

(56) References Cited

U.S. PATENT DOCUMENTS

| | | |
|---|---|---|
| 10,490,620 B1 * | 11/2019 | Lai .................... G02F 1/133308 |
| 2017/0150618 A1 | 5/2017 | Choi et al. |
| 2019/0013374 A1 * | 1/2019 | Park .................... H01L 27/3248 |
| 2019/0131360 A1 | 5/2019 | Lee et al. |
| 2019/0261512 A1 * | 8/2019 | Huang ................ H01L 27/3276 |
| 2019/0312097 A1 | 10/2019 | Choi et al. |
| 2020/0035762 A1 | 1/2020 | Kim et al. |
| 2020/0161397 A1 | 5/2020 | Pang |
| 2020/0176527 A1 | 6/2020 | An et al. |
| 2020/0176539 A1 | 6/2020 | Sung et al. |

FOREIGN PATENT DOCUMENTS

| | | |
|---|---|---|
| EP | 3 176 771 A2 | 6/2017 |
| EP | 3 232 431 A1 | 10/2017 |
| KR | 10-2017-0059527 A | 5/2017 |
| KR | 10-2017-0065059 A | 6/2017 |
| KR | 10-2018-0096875 A | 8/2018 |

* cited by examiner

DISPLAY PANEL

CROSS-REFERENCE TO RELATED APPLICATIONS

This application is a continuation of U.S. patent application Ser. No. 16/779,303, filed Jan. 31, 2020, which claims priority to and the benefit of Korean Patent Application No. 10-2019-0027015, filed Mar. 8, 2019, the entire content of both of which is incorporated herein by reference.

BACKGROUND

1. Field

One or more embodiments relate to a display panel.

2. Description of the Related Art

Applications of display devices have recently diversified. Additionally, due to their relatively small thickness and light weight, their range of applications has increased.

Given that display devices are utilized for a variety of reasons, various methods may be used to design the shapes of display devices, and functions that may be applied or linked to display devices may increase.

The above information disclosed in this Background section is only for enhancement of understanding of the background and therefore the information discussed in this Background section does not necessarily constitute prior art.

SUMMARY

One or more example embodiments include, as a method of increasing a function that may be connected or linked to a display device, a display panel including areas in which a camera, a sensor, etc. may be arranged inside a display area, and a device including the display panel.

However, the one or more embodiments are only examples, and the scope of the present disclosure is not limited thereto.

Additional aspects will be set forth in part in the description which follows and, in part, will be apparent from the description, or may be learned by practice of the presented embodiments.

According to some example embodiments, a display panel includes: a substrate including a first region, a second region, a non-display area surrounding the first region and the second region, and a display area surrounding the non-display area; a plurality of pixels arranged in the display area; wirings supplying signals to the plurality of pixels; a load matching area connected to first wirings of the wirings, the load matching area including load units arranged in the non-display area; and a dummy area including dummy units spaced apart from the load units in the non-display area, wherein each of the load units includes a load semiconductor layer, a first load conductive layer, and a second load conductive layer which at least partially overlap each other with an insulating layer therebetween, and the load semiconductor layer is connected to the second load conductive layer via a first contact hole.

According to some example embodiments, the first wirings may extend to the non-display area and be connected to the first load conductive layer.

According to some example embodiments, each of the dummy units may include a dummy semiconductor layer, a first dummy conductive layer, and a second dummy conductive layer which at least partially overlap each other with an insulating layer therebetween, and the dummy semiconductor layer and the first dummy conductive layer may be connected to the second dummy conductive layer via a second contact hole and a third contact hole, respectively.

According to some example embodiments, the first region and the second region may be arranged from left to right in a first direction, wherein the load matching area may includes a first load matching area positioned on a left side of the first region and a second load matching area positioned on a right side of the second region.

According to some example embodiments, the first load matching area may have a convex shape in a direction opposite to the first direction.

According to some example embodiments, the load matching area may further include a third load matching area positioned on a right side of the first region and a fourth load matching area positioned on a left side of the second region.

According to some example embodiments, the third load matching area may include an upper area and a lower area arranged in a second direction perpendicular to the first direction, and widths of the upper area and the lower area in the first direction may gradually increase in the second direction and then decrease.

According to some example embodiments, load units of the first load matching area may be connected to load units of the third load matching area through wirings that detour around the first region.

According to some example embodiments, the dummy area may be positioned between the first region and the second region.

According to some example embodiments, the first region and the second region may be arranged from left to right in a first direction, wherein the load matching area may include a third load matching area positioned on a right side of the first region and a fourth load matching area positioned on a left side of the second region.

According to some example embodiments, the first wirings connected to the third load matching area may detour around the first region.

According to some example embodiments, a display panel includes: a substrate including a first region, a second region, a non-display area surrounding the first region and the second region, and a display area surrounding the non-display area; a plurality of pixels arranged in the display area; scan lines connected to the plurality of pixels, the scan lines extending in a first direction; data lines connected to the plurality of pixels, the data lines extending in a second direction intersecting with the first direction; and a load matching area connected to first scan lines of the scan lines, the load matching area including load units arranged in the non-display area, wherein each of the load units includes a load semiconductor layer, a first load conductive layer, and a second load conductive layer which at least partially overlap each other with an insulating layer therebetween, and the load semiconductor layer is electrically connected to the second load conductive layer, wherein the load units overlap some of the data lines.

According to some example embodiments, the second load conductive layer may be positioned on same layer as the data lines and may be spaced apart from the data lines.

According to some example embodiments, the first load conductive layer may overlap some of the data lines.

According to some example embodiments, the data lines may include first data lines and second data lines arranged on different layers, wherein the second data lines may alternate with the first data lines in a region around the first region and the second region.

According to some example embodiments, the display panel may further include: a dummy area positioned between the first region and the second region, the dummy area including a dummy unit, wherein the dummy unit may include a dummy semiconductor layer, a first dummy conductive layer, and a second dummy conductive layer which at least partially overlap each other with an insulating layer therebetween, and the dummy semiconductor layer and the first dummy conductive layer may be connected to the second dummy conductive layer via a second contact hole and a third contact hole, respectively.

According to some example embodiments, the first region and the second region may be arranged from left to right in the first direction, wherein the load matching area may include a first load matching area positioned on a left side of the first region and a second load matching area positioned on a right side of the second region.

According to some example embodiments, the load matching area may further include a third load matching area positioned on a right side of the first region and a fourth load matching area positioned on a left side of the second region.

According to some example embodiments, the first region and the second region may be arranged from left to right in the first direction, wherein the load matching area may include a third load matching area positioned on a right side of the first region and a fourth load matching area positioned on a left side of the second region.

According to some example embodiments, the display panel may further include: a third region positioned between the first region and the second region, wherein the first region, the third region, and the second region may be arranged from left to right in the first direction, wherein the load matching area may include a first load matching area positioned on a left side of the first region and a second load matching area positioned on a right side of the second region.

According to some example embodiments, the display panel may further include a driving voltage line applying a driving voltage to the plurality of pixels, wherein the second load conductive layer may be connected to the driving voltage line.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
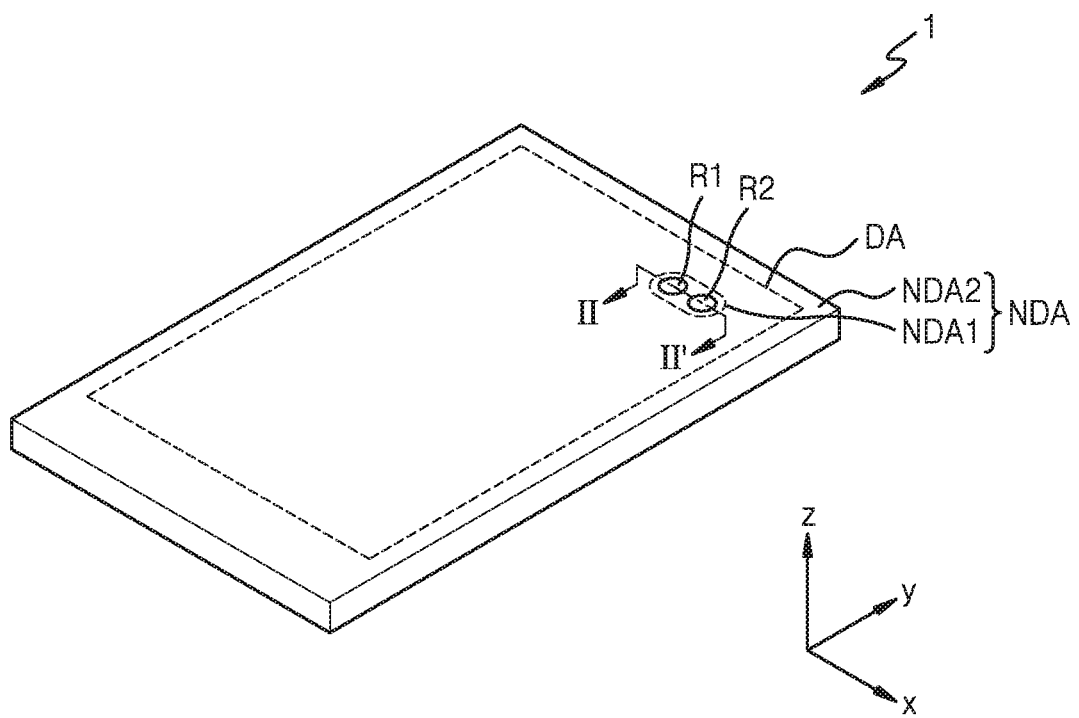
FIG. 1 is a schematic perspective view of a display device according to some example embodiments.

As the present disclosure allows for various changes and numerous embodiments, aspects of some example embodiments will be illustrated in the drawings and described in more detail in the written description. Hereinafter, effects and features of the present disclosure and a method for accomplishing them will be described more fully with reference to the accompanying drawings, in which embodiments of the present disclosure are shown. This disclosure may, however, be embodied in many different forms and should not be construed as limited to the embodiments set forth herein.

One or more example embodiments of the present disclosure will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will also be understood that when a layer, region, or component is referred to as being "connected" or "coupled" to another layer, region, or component, it can be directly connected or coupled to the other layer, region, or component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic perspective view of a display device 1 according to some example embodiments.

Referring to FIG. 1, the display device 1 includes a display area DA that emits light and a non-display area NDA that does not emit light.

The display device 1 may provide an image through the display area DA. The display device 1 may include a liquid crystal display (LCD), an electrophoretic display, an organic light-emitting display, an inorganic light-emitting display, a quantum-dot light emitting display, a field emission display, a surface-conduction electron-emitter display, a plasma display, or a cathode ray display.

Although an organic light-emitting display will now be illustrated and described as the display device 1 according to some example embodiments, the present disclosure is not limited thereto, and various types of display devices may be used.

The display device 1 includes a first region R1 and a second region R2. In the first region R1 and the second region R2, electronic elements are arranged as will be described later with reference to FIG. 2A and the like. The first and second regions R1 and R2 may be understood as opening areas or transmission areas capable of transmitting light or/and sound that is output from the electronic elements to the outside or travels from the outside toward the electronic elements. Although opening areas or transmission areas are the first region R1 and the second region R2 in FIG. 1, the present disclosure is not limited thereto, and three or more opening areas or) transmission areas may be included.

According to some example embodiments, when light passes through the first region R1 and the second region R2, a light transmittance may be about 50% or greater, about 70% or greater, about 80% or greater, or about 85% or greater.

The non-display area NDA may include a first non-display area NDA1 surrounding the first and second regions R1 and R2, and a second non-display area NDA2 surrounding the display area DA. The first non-display area NDA1 may entirely surround the first and second regions R1 and R2, the display area DA may entirely surround the first non-display area NDA1, and the second non-display area NDA2 may entirely surround the display area DA.

Although the first and second regions R1 and R2 are positioned on the upper right side of the display area DA in FIG. 1, the present disclosure is not limited thereto. According to some example embodiments, locations of the first region R1 and the second region R2 may vary.

Figure 2:
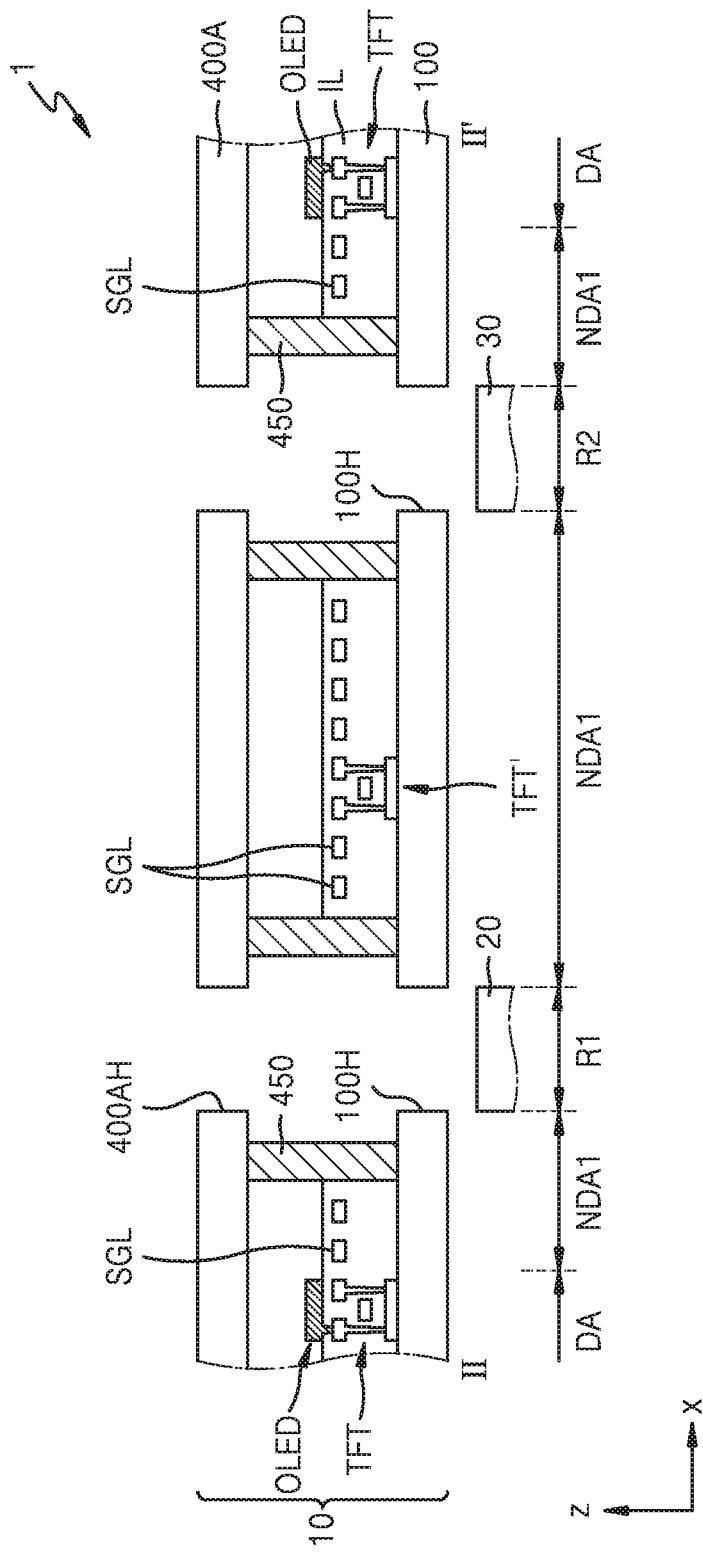
FIG. 2 is a cross-sectional view of a display device according to some example embodiments.

FIG. 2 is a cross-sectional view of a display device 1 according to some example embodiments, and may correspond to a cross-section taken along the line II-II' of FIG. 1.

Referring to FIG. 2, the display device 1 may include a display panel 10 and first and second electronic elements 20 and 30 respectively corresponding to the first and second regions R1 and R2 of the display panel 10. According to some example embodiments, a component(s), such as an input sensing member for sensing a touch input, an anti-reflection member including a polarizer and a retarder, or a color filter and a black matrix, and a transparent window, may be arranged on the display panel 10.

The display panel 10 may include a substrate 100, an encapsulation substrate 400A as an encapsulation member that faces the substrate 100, and a sealing member 450 between the substrate 100 and the encapsulation substrate 400A.

The substrate 100 may include glass or polymer resin. Examples of the polymer resin may include polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 including polymer resin may be flexible, rollable, or bendable. The substrate 100 may have a multi-layered structure including a layer including the aforementioned polymer resin and an inorganic layer (not shown). The encapsulation substrate 400A may include glass or the aforementioned polymer resin.

A thin-film transistor TFT, an organic light-emitting diode OLED as a display element connected to the thin-film transistor TFT, and signal lines SGL are arranged on the display area DA of the substrate 100. Signal lines SGL and a dummy thin-film transistor TFT' are arranged on the first non-display area NDA1 of the substrate 100.

According to some example embodiments, signal lines SGL may provide a certain signal (e.g., a data signal and a scan signal) to display elements spaced apart from each other in a y direction about the first and second regions R1 and R2.

The display panel 10 may include through holes corresponding to the first and second regions R1 and R2. For example, the substrate 100 and the encapsulation substrate 400A may include through holes 100H and through holes 400AH, respectively, wherein the through holes 100H correspond to the first and second regions R1 and R2 and the through holes 400AH correspond to the first and second regions R1 and R2, and portions of an insulating layer IL or elements between the substrate 100 and the encapsulation substrate 400A, the portions corresponding to the first and second regions R1 and R2, may be all removed.

FIG. 2 illustrates that sealing members 450 are arranged on both sides of the first and second regions R1 and R2, but, when viewed from a direction perpendicular to a main surface of the substrate 100, the first and second regions R1 and R2 may be understood as being entirely surrounded by the sealing members 450.

The first and second electronic elements 20 and 30 may be positioned in the first and second regions R1 and R2, respectively. The first and second electronic elements 20 and 30 may be electronic elements that use light or sound. For example, an electronic element may be a sensor that receives and uses light, like an infrared sensor, a camera that receives light and captures an image, a sensor that outputs and senses light or sound to measure a distance or recognize a fingerprint or the like, a small lamp that outputs light, or a speaker that outputs sound. An electronic element using light may use light in various wavelength bands, such as visible light, infrared light, and ultraviolet light.

In the case where the display panel 10 includes through holes corresponding to the first and second regions R1 and R2, as in FIG. 2, light or sound output or received by the first and second electronic elements 20 and 30 may be more effectively utilized.

Although the display panel 10 in FIG. 2 includes the through holes corresponding to the first and second regions R1 and R2, embodiments according to the present disclosure are not limited thereto. For example, the encapsulation substrate 400A may include the through holes 400AH corresponding to the first and second regions R1 and R2 but the substrate 100 may include no through holes. According to some example embodiments, both the encapsulation substrate 400A and the substrate 100 in the display panel 10 may not include through holes corresponding to the first and second regions R1 and R2. Even though the substrate 100 and the encapsulation substrate 400A do not include through holes, portions of the insulating layer IL or elements between the substrate 100 and the encapsulation substrate 400A, the portions corresponding to the first and second regions R1 and R2, may be removed and thus light transmittance of the first and second electronic elements 20 and 30 may be secured.

Figure 3:
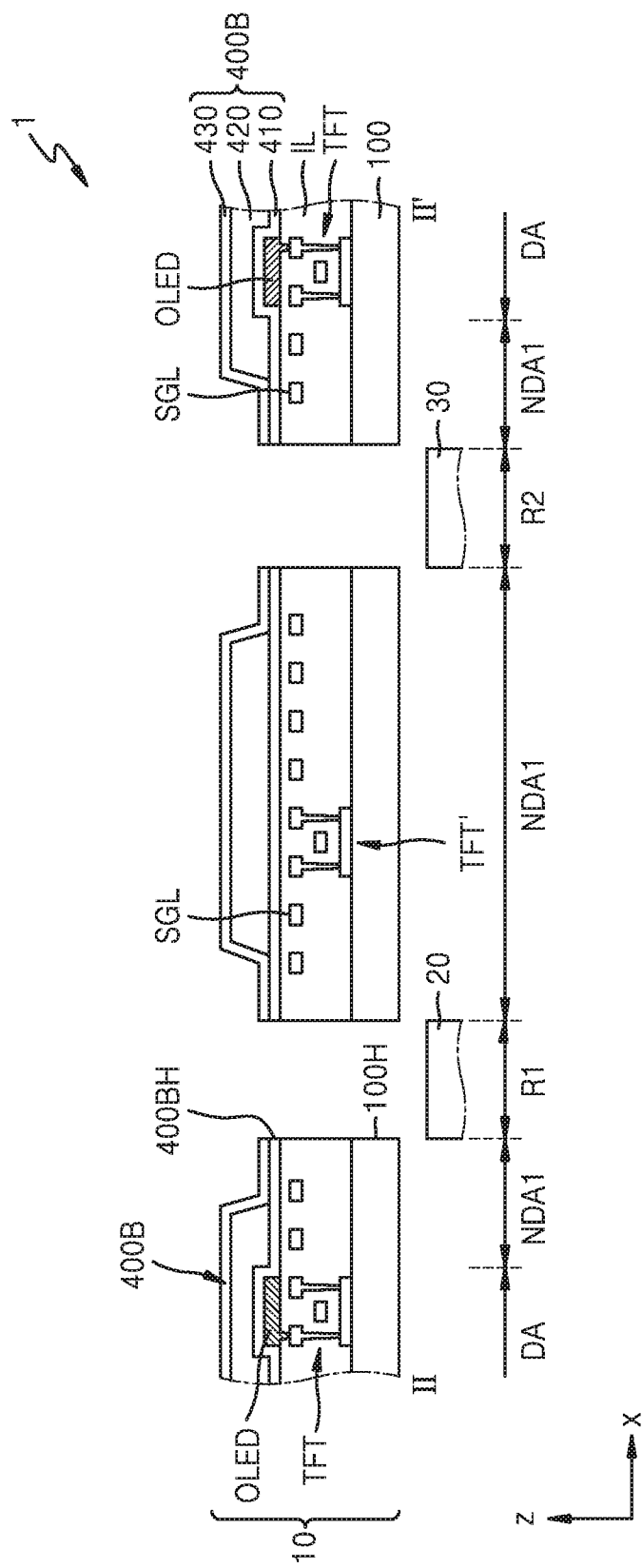
FIG. 3 is a cross-sectional view of a display device according to some example embodiments.

FIG. 3 is a cross-sectional view of a display device 1 according to some example embodiments, and may correspond to a cross-section taken along the line II-II' of FIG. 1.

Similar to the display device 1 described above with reference to FIG. 2, the display device 1 of FIG. 3 may include a display panel 10 including a display element, and first and second electronic elements 20 and 30 respectively corresponding to first and second regions R1 and R2 of the display panel 10. According to some example embodiments, the display device 1 may further include an input detection member for sensing a touch input, a reflection prevention member, a window, etc., arranged on the display panel 10.

Unlike the display panel 10 described above with reference to FIG. 2, which includes the encapsulation substrate 400A and the sealing members 450 as an encapsulation member, the display panel 10 according to some example embodiments may include a thin-film encapsulation layer 400B. In this case, the display panel 10 may have more improved flexibility. Hereinafter, for convenience of description, differences therebetween will be mainly described.

The thin-film encapsulation layer 400B may include at least one inorganic encapsulation layer and at least one organic encapsulation layer. With regard to this, FIG. 3 illustrates first and second inorganic encapsulation layers 410 and 430 and an organic encapsulation layer 420 therebetween.

The first and second inorganic encapsulation layers 410 and 430 may include at least one inorganic insulating material, such as aluminum oxide, titanium oxide, tantalum oxide, hafnium oxide, zinc oxide, SL-1icon oxide, SL-1icon nitride, and SL-1icon oxynitride. The organic encapsulation layer 420 may include a polymer-based material. Examples of the polymer-based material may include acrylic resin, epoxy resin, polyimide, and polyethylene.

The display panel 10 may include through holes corresponding to the first and second regions R1 and R2. For example, the substrate 100 and the thin-film encapsulation layer 400B may include through holes 100H corresponding to the first and second regions R1 and R2 and through holes 400BH corresponding to the first and second regions R1 and R2, respectively. As described above, the first and second electronic elements 20 and 30 using light or sound may be arranged in the first and second regions R1 and R2, respectively.

Unlike FIG. 3 in which the display panel 10 includes the through holes corresponding to the first and second regions R1 and R2, the display panel 10 may not include through holes. For example, the thin-film encapsulation layer 400B may include the through holes 400BH corresponding to the first and second regions R1 and R2 but the substrate 100 may include no through holes. According to some example embodiments, both the thin-film encapsulation layer 400B and the substrate 100 may not include through holes corresponding to the first and second regions R1 and R2. Even though the substrate 100 does not include the through holes 100H, portions of an insulating layer IL or elements between the substrate 100 and the thin-film encapsulation layer 400B, the portions corresponding to the first and second regions R1 and R2, may be removed and thus light transmittance of the first and second electronic elements 20 and 30 may be secured.

Figure 4:
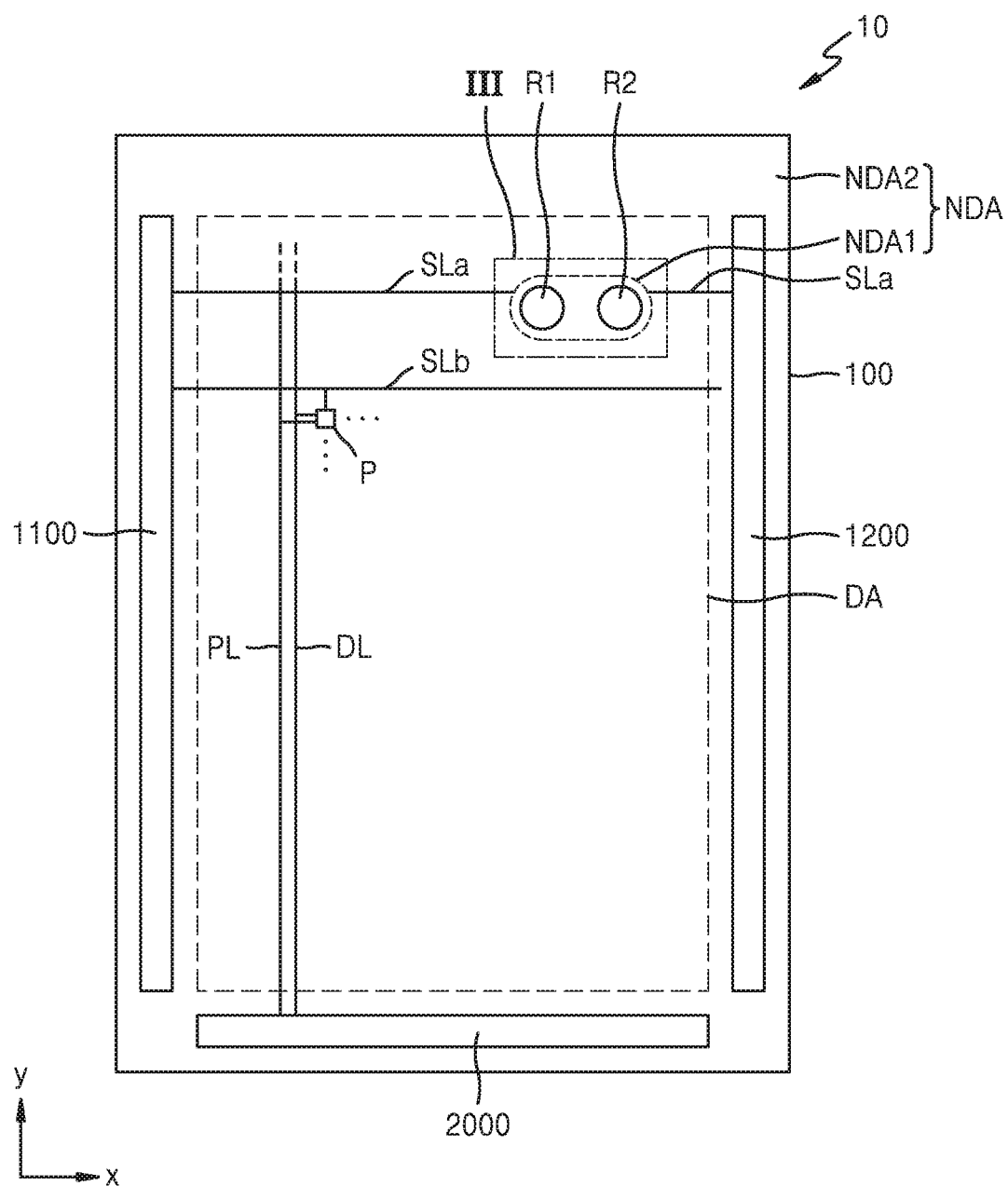
FIG. 4 is a schematic plan view of a display panel according to some example embodiments.

FIG. 4 is a schematic plan view of a display panel 10 according to some example embodiments.

Referring to FIG. 4, the display panel 10 includes a plurality of pixels P arranged in a display area DA. The plurality of pixels P may be connected to scan lines SLa and SLb extending in a first direction and a data line DL and a drive voltage line PL each extending in a second direction intersecting the first direction.

Each of the pixels P may include a display element, such as an organic light-emitting diode. The pixel PX may emit, for example, red light, green light, blue light, or white light via the organic light-emitting diode. The pixel PX used herein may be understood as a pixel that emits one of red light, green light, blue light, and white light as described above. The display area DA may be protected from external air or moisture by being covered by the encapsulation member described above with reference to FIGS. 2 and 3.

A first non-display area NDA1 surrounds first and second regions R1 and R2. The first non-display area NDA1 is an area in which no images are displayed. Signal lines that provide signals to pixels P around the first and second regions R1 and R2 may be arranged in the first non-display area NDA1.

A first scan driver 1100 and a second scan driver 1200 for providing scan signals to the pixels P may be arranged in a second non-display area NDA2. The first scan driver 1100 may be positioned to correspond to the left side of the display area DA and the second scan driver 1200 may be positioned to correspond to the right side of the display area DA.

A scan signal generated by the first scan driver 1100 may be provided to some pixels P and a scan signal generated by the second scan driver 40 may be provided to the remaining pixels P.

The first scan driver 1100 and the second scan driver 1200 may be respectively arranged on both sides of the display area DA and may perform dual scanning. For example, the first scan driver 1100 may generate a scan signal and transmit the generated scan signal to some pixels from among the pixels P included in the display area DA, and the second scan driver 1200 may generate a scan signal and transmit the generated scan signal to the remaining pixels from among the pixels P included in the display area DA. The first scan driver 1100 and the second scan driver 1200 may be synchronized by a synchronized clock signal.

According to some example embodiments, pixels P arranged on the left side of the first non-display area NDA1 may receive the scan signal generated by the first scan driver 1100, and pixels P arranged on the right side of the first non-display area NDA1 may receive the scan signal generated by the second scan driver 1200.

A data driver 2000 for providing data signals to the pixels P and dummy pixels, a main power supply line for providing a driving voltage and a common voltage, and the like may be arranged in the second non-display area NDA2.

Figure 5A:
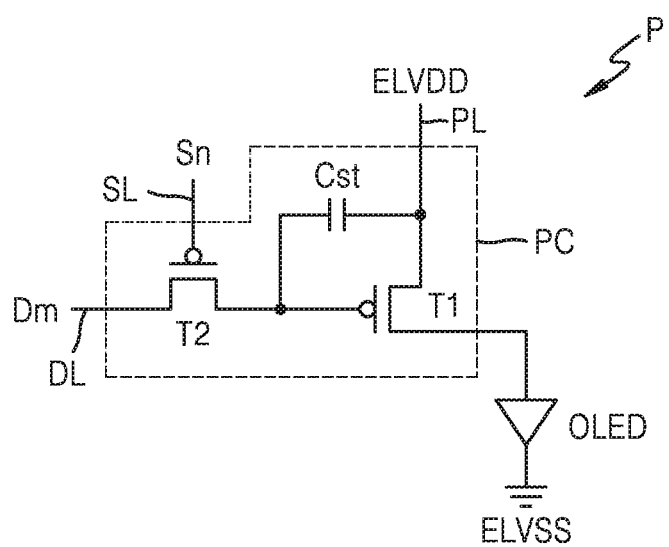
FIGS. 5A and 5B are equivalent circuit diagrams of a pixel that may be utilized according to some example embodiments.
Figure 5B:
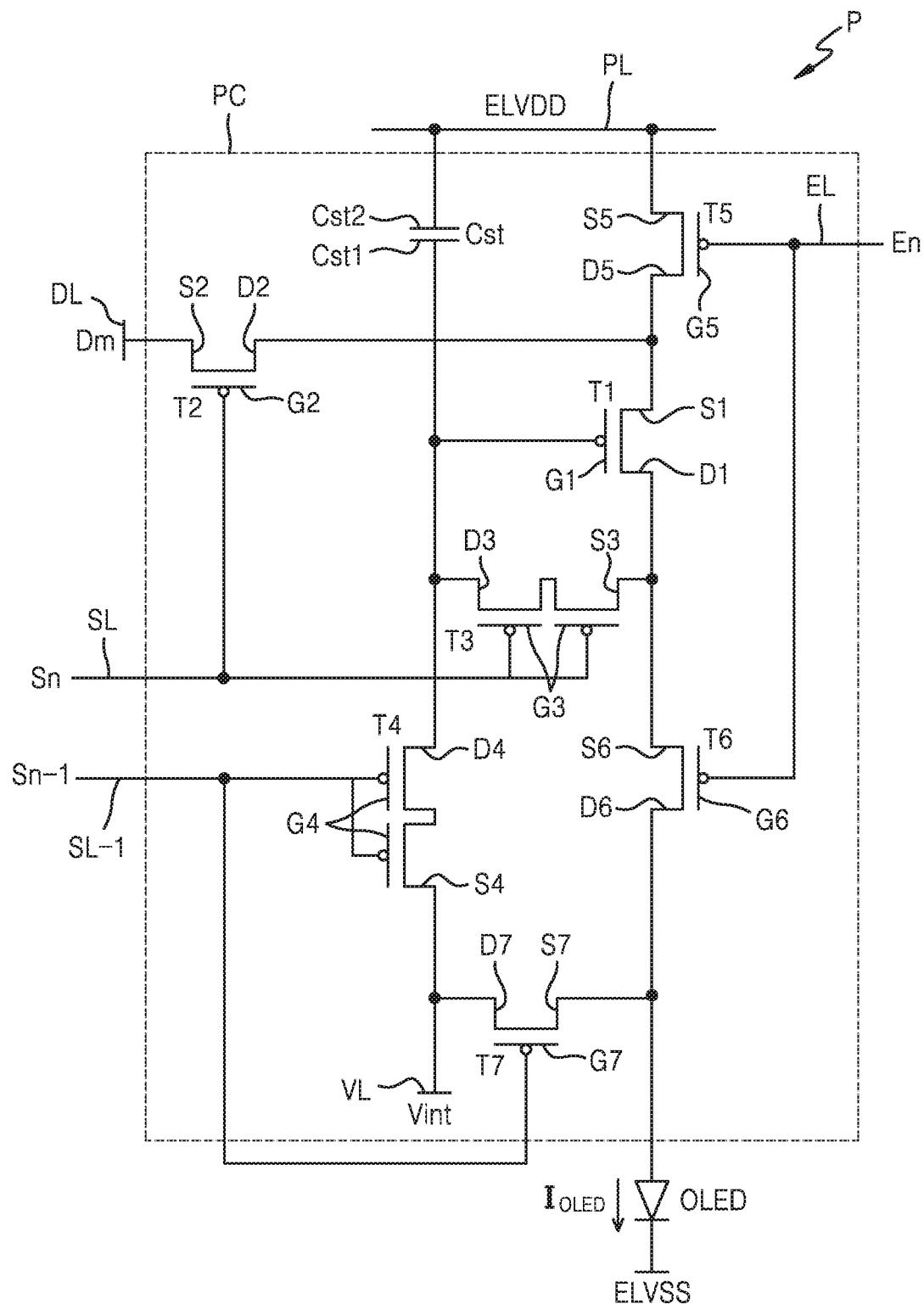

FIGS. 5A and 5B are equivalent circuit diagrams of a pixel P of a display panel according to some example embodiments.

Referring to FIG. 5A, each pixel P includes a pixel circuit PC connected to a scan line SL and a data line DL, and an organic light-emitting diode OLED connected to the pixel circuit PC.

The pixel circuit PC may include a driving thin-film transistor (TFT) T1, a switching TFT T2, and a storage capacitor Cst. The switching TFT T2 is connected to the scan line SL and the data line DL, and transmits, to the driving TFT T1, a data signal Dm received via the data line DL according to a scan signal Sn received via the scan line SL.

The storage capacitor Cst is connected to the switching TFT T2 and a driving voltage line PL, and stores a voltage corresponding to a difference between a voltage received from the switching TFT T2 and a first power supply voltage (or a driving voltage) ELVDD supplied to the driving voltage line PL.

The driving TFT T1 is connected to the driving voltage line PL and the storage capacitor Cst, and may control a driving current flowing from the driving voltage line PL to the organic light-emitting diode OLED, in accordance with a voltage value stored in the storage capacitor Cst. The organic light-emitting diode OLED may emit light having a certain brightness according to the driving current.

Although a case where the pixel circuit PC includes two TFTs and one storage capacitor is illustrated in FIG. 5A, the present disclosure is not limited thereto. As shown in FIG. 5B, the pixel circuit PC may include seven TFTs and one storage capacitor.

Referring to FIG. 5B, each pixel P includes a pixel circuit PC and an organic light-emitting diode OLED connected to the pixel circuit PC. The pixel circuit PC may include a plurality of TFTs and a storage capacitor Cst. The TFTs and the storage capacitor may be connected to signal lines SL, SL-1, EL, and DL, an initializing voltage line VL, and a driving voltage line PL.

Although each pixel P is connected to the signal lines SL, SL-1, EL, and DL, the initializing voltage line VL, and the driving voltage line PL in FIG. 5B, the present disclosure is not limited thereto. According to some example embodiments, the initializing voltage line VL, the driving voltage line PL, and at least one of the signal lines SL, SL-1, EL, or DL may be shared by neighboring pixels.

The plurality of TFTs may include a driving TFT T1, a switching TFT T2, a compensating TFT T3, a first initializing TFT T4, an operation control TFT T5, a light-emission control TFT T6, and a second initializing TFT T7.

The signal lines SL, SL-1, EL, and DL may include a scan line SL that transmits a scan signal Sn, a previous scan line SL-1 that transmits a previous scan signal Sn-1 to the second initializing TFT T7, a light-emission control line EL that transmits a light-emission control signal En to the operation control TFT T5 and the light-emission control TFT T6, and a data line DL that intersects with the scan line SL and transmits a data signal Dm. The driving voltage line PL transmits a driving voltage ELVDD to the driving TFT T1, and the initializing voltage line VL transmits an initializing voltage Vint that initiates the driving TFT T1 and a pixel electrode of the organic light-emitting diode OLED.

The driving TFT T1 includes a driving gate electrode G1 connected to a first storage capacitor plate Cst1 of the storage capacitor Cst, a driving source electrode S1 connected to the driving voltage line PL, which is a lower driving voltage line, via the operation control TFT T5, and a driving drain electrode D1 electrically connected to the pixel electrode of the organic light-emitting diode OLED via the light-emission control TFT T6. The driving TFT T1 receives the data signal Dm according to a switching operation of the switching TFT T2 and supplies a driving current IDLED to the organic light-emitting diode OLED.

The switching TFT T2 includes a switching gate electrode G2 connected to the scan line SL, a switching source electrode S2 connected to the data line DL, and a switching drain electrode D2 connected to the driving source electrode S1 of the driving TFT T1 and also connected to the driving voltage line PL via the operation control TFT T5. The switching TFT T2 is turned on according to the scan signal Sn received via the scan line SL and performs a switching operation of transmitting the data signal Dm received from the data line DL to the driving source electrode S1 of the driving TFT T1.

The compensating TFT T3 includes a compensating gate electrode G3 connected to the scan line SL, a compensating source electrode S3 connected to the driving drain electrode D1 of the driving TFT T1 and also connected to the pixel electrode of the organic light-emitting diode OLED via the light-emission control TFT T6, and a compensating drain electrode D3 connected to the first storage capacitor plate Cst1 of the storage capacitor Cst, a first initializing drain electrode D4 of the first initializing TFT T4, and the driving gate electrode G1 of the driving TFT T1. The compensating TFT T3 is turned on according to the scan signal Sn received via the scan line SL and electrically connects the driving gate electrode S1 and the driving drain electrode D1 of the driving TFT T1 to each other, such that the driving TFT T1 is diode-connected.

The first initializing TFT T4 includes a first initializing gate electrode G4 connected to the previous scan line SL-1, a first initializing source electrode S4 connected to a second initializing drain electrode D7 of the second initializing TFT T7 and the initializing voltage line VL, and the first initializing drain electrode D4 connected to the first storage capacitor plate Cst1 of the storage capacitor Cst, the compensating drain electrode D3 of the compensating TFT T3, and the driving gate electrode G1 of the driving TFT T1. The first initializing TFT T4 is turned on according to the previous scan signal Sn-1 received via the previous scan line SL-1 and transmits the initializing voltage Vint to the driving gate electrode G1 of the driving TFT T1 to thereby initialize a voltage of the driving gate electrode G1 of the driving TFT T2.

The operation control TFT T5 includes an operation control gate electrode G5 connected to the light-emission control line EL, an operation control source electrode S5 connected to the driving voltage line PL, and an operation control drain electrode D5 connected to the driving source electrode S1 of the driving TFT T1 and the switching drain electrode D2 of the switching TFT T2.

The light-emission control TFT T6 includes a light-emission control gate electrode G6 connected to the light-emission control line EL, a light-emission control source electrode S6 connected to the driving drain electrode D1 of the driving TFT T1 and the compensating source electrode S3 of the compensating TFT T3, and a light-emission control drain electrode D6 electrically connected to a second initializing source electrode S7 of the second initializing TFT T7 and the pixel electrode of the organic light-emitting diode OLED.

The operation control TFT T5 and the light-emission control TFT T6 are simultaneously turned on according to the light-emission control signal En received via the light-emission control line EL, and thus the driving voltage ELVDD is transmitted to the organic light-emitting diode OLED such that the driving current IDLED may flow in the organic light-emitting diode OLED.

The second initializing TFT T7 includes a second initializing gate electrode G7 connected to the previous scan line SL-1, the second initializing source electrode S7 connected to the light-emission control drain electrode D6 of the light-emission control TFT T6 and the pixel electrode of the organic light-emitting diode OLED, and the second initializing drain electrode D7 connected to the first initializing source electrode S4 of the first initializing TFT T4 and the initializing voltage line VL. The second initializing TFT T7 is turned on according to the previous scan signal Sn-1 received via the previous scan line SL-1 and initializes the pixel electrode of the organic light-emitting diode OLED.

Although the first initializing TFT T4 and the second initializing TFT T7 are connected to the previous scan line SL-1 in FIG. 5B, the present disclosure is not limited thereto. According to some example embodiments, the first initializing TFT T4 may be connected to the previous scan line SL-1 and operate according to the previous scan signal Sn-1, and the second initializing TFT T7 may be connected to a separate signal line (for example, a subsequent scan line) and operate according to a signal transmitted to the separate signal line.

A second storage capacitor plate Cst2 of the storage capacitor Cst is connected to the driving voltage line PL, and an opposite electrode of the organic light-emitting diode OLED is connected to a common voltage ELVSS. Accordingly, the organic light-emitting diode OLED may receive the driving current IDLED from the driving TFT T1 and emit light, thereby displaying an image.

Although each of the compensating TFT T3 and the first initializing TFT T4 has a dual gate electrode in FIG. 5B, each of the compensating TFT T3 and the first initializing TFT T4 may have a single gate electrode.

Figure 6:
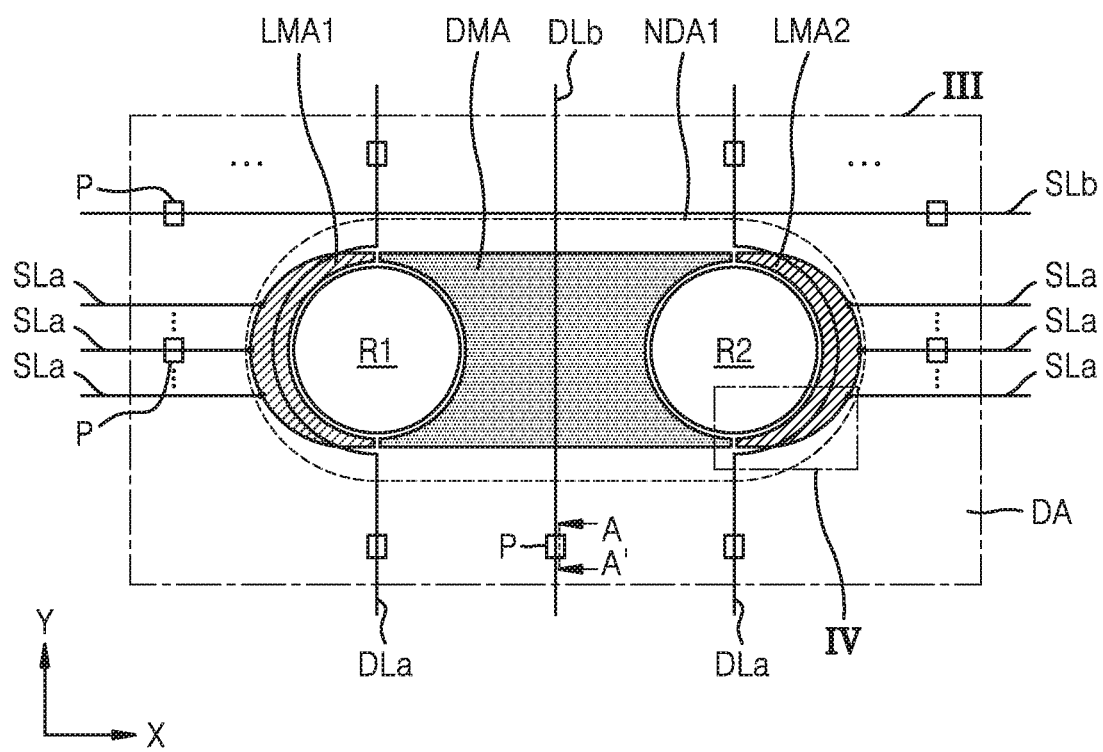
FIG. 6 is a magnified plan view of a region III of FIG. 4.
Figure 7:
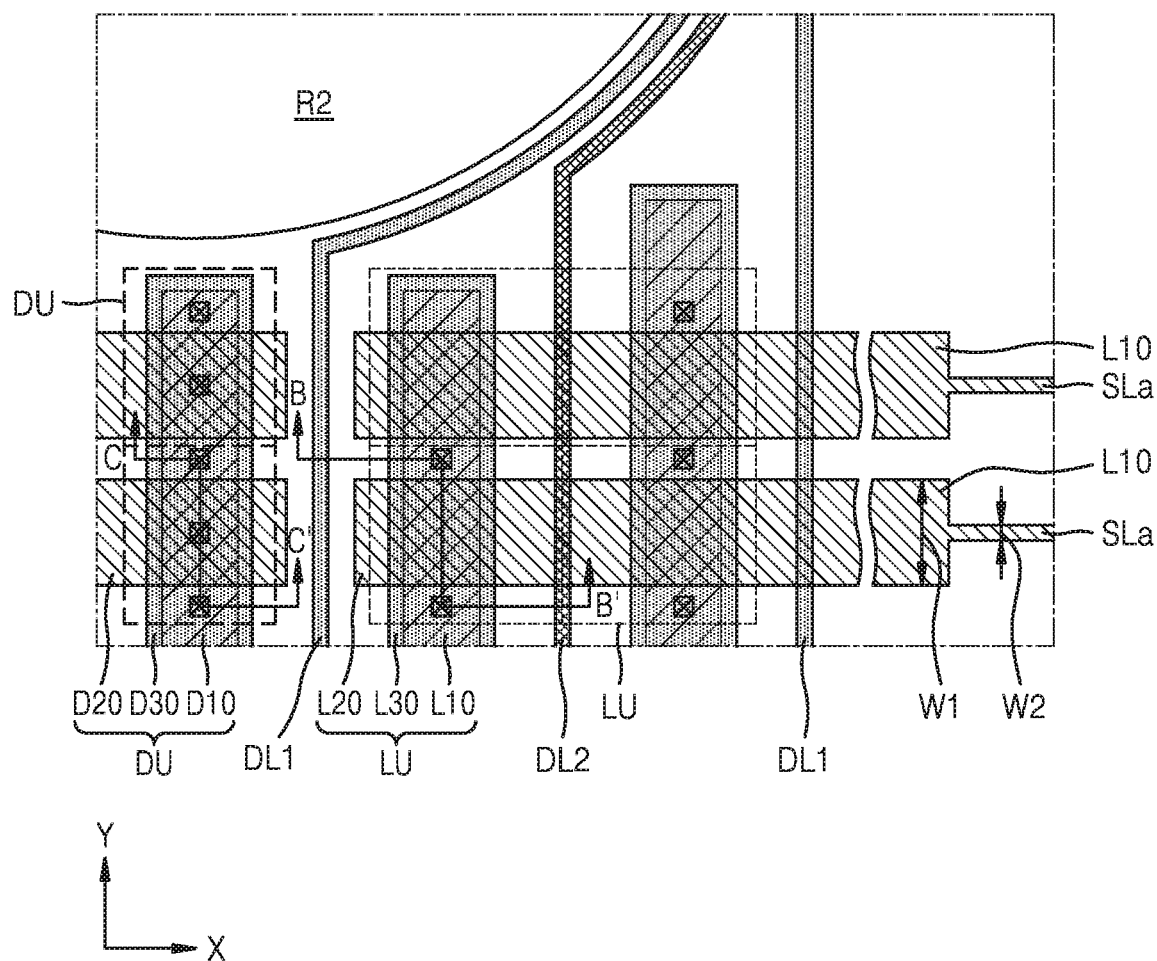
FIG. 7 is a magnified plan view of a region IV of FIG. 6.
Figure 8:
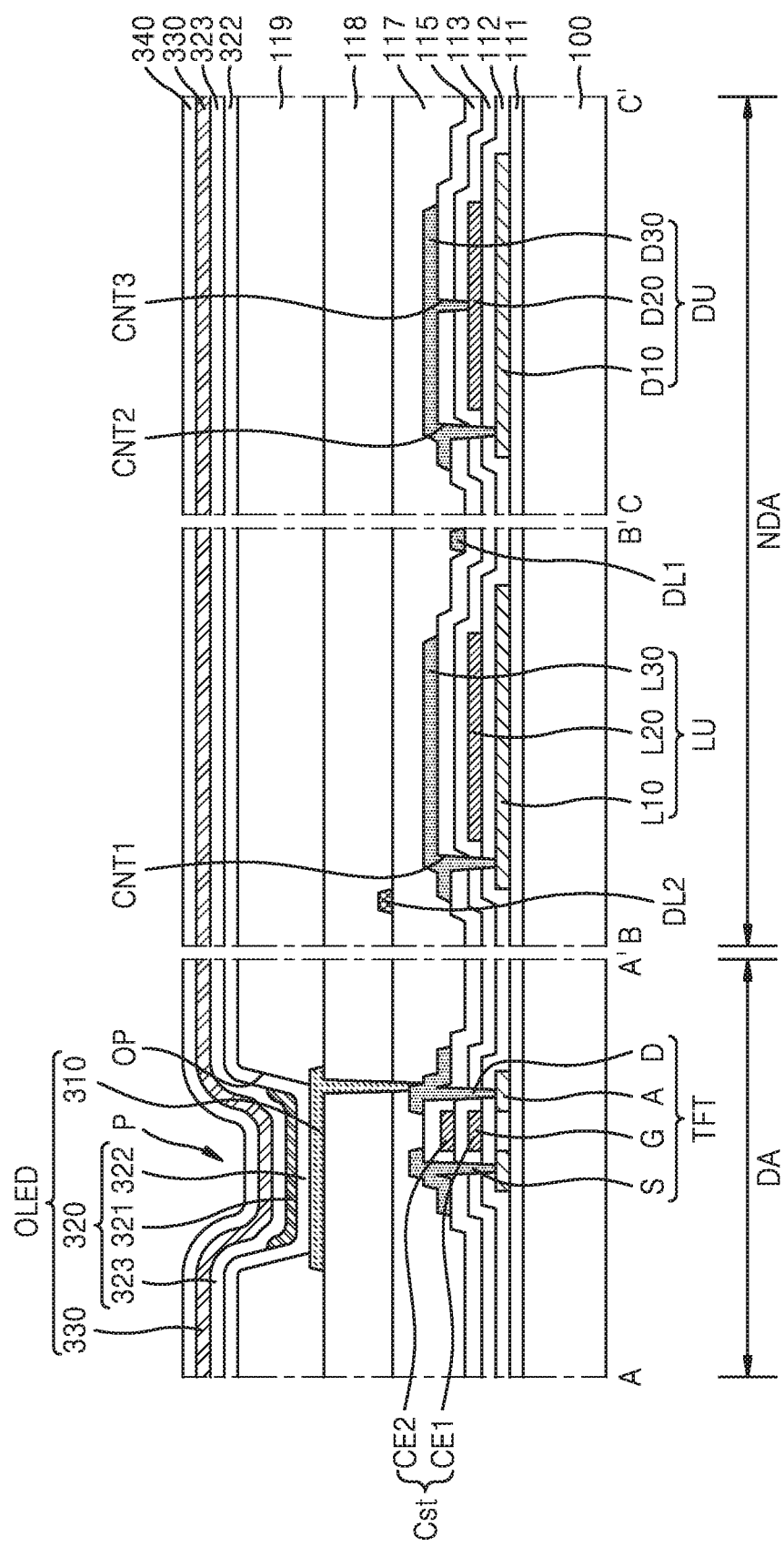
FIG. 8 is a cross-sectional view of the display panel taken along the line A-A' of FIG. 6 and the lines B-B' and C-C' of FIG. 7.

FIG. 6 is a magnified plan view of a region III of FIG. 4, FIG. 7 is a magnified plan view of a region IV of FIG. 6, and FIG. 8 is a cross-sectional view of the display panel taken along line A-A' of FIG. 6 and lines B-B' and C-C' of FIG. 7.

Referring to FIG. 6, the first region R1 and the second region R2 are arranged in a first direction, the first non-display area NDA1 surrounds the first region R1 and the second region R2, and the display area DA surrounds the first non-display area NDA1.

A plurality of pixels P may be arranged in the display area DA, and a first load matching area LMA1, a second load matching area LMA2, and a dummy area DMA may be arranged in the first non-display area NDA1.

A plurality of signal lines may be arranged to electrically connect the plurality of pixels P. With regard to this, FIG. 6 illustrates that first and second scan lines SLa and SLb each extending in the first direction (x direction) connect pixels P in the display area DA and first and second data lines DLa and DLb connect pixels P in a second direction (y direction) intersecting with the first direction.

According to some example embodiments, the first scan lines SLa of the first and second scan lines SLa and SLb may each extend in the first direction (x direction), but may be cut in the first non-display area NDA1.

Second scan lines SLb arranged far from the first region R1 and the second region R2 in the first non-display area NDA1 or second scan lines SLb that do not traverse the first non-display area NDA1 may extend to traverse the display area DA in the first direction without being cut. In this case, some of the second scan lines SLb that traverse the first non-display area NDA1 may be arranged to detour around the first region R1 and the second region R2 without being cut.

If the first and second scan lines SLa and SLb that traverse the first non-display area NDA1 are arranged to detour around the first region R1 and the second region R2 without being cut, the space of the first non-display area NDA1 may be more required due to the detour of the scan lines SLa and SLb.

According to some example embodiments, the first scan lines SLa of the first and second scan lines SLa and SLb that traverse the first non-display area NDA1 are cut in the first non-display area NDA1, and thus, the space of the first non-display area NDA1, for example, an upper or lower area of the first non-display area NDA1, may be reduced.

The lengths of the first scan lines SLa are shorter than those of the second scan lines SLb and the number of pixels P connected to the first scan lines SLa is less than that those connected to the second scan lines SLb, and thus, loads connected to the first scan lines SLa may be different from loads connected to the second scan lines SLb.

Accordingly, according to some example embodiments, a load matching area in which load units are connected to the first scan lines SLa to match the loads connected to the first scan lines SLa to the loads connected to the second scan lines SLb, is provided.

Also, according to some example embodiments, a dummy area DMA for matching pattern density may be positioned in the first non-display area NDA1 in which the load matching areas LMA1 and LMA2 are not arranged.

The load matching area may include a first load matching area LMA1 and a second load matching area LMA2. The first load matching area LMA1 may be positioned on the left side of the first region R1 and connected to first scan lines SLa positioned on the left side of the first region R1. The second load matching area LMA2 may be positioned on the right side of the second region R2 and connected to first scan lines SLa positioned on the right side of the second region R2.

The first load matching area LMA1 may have a convex shape in the first direction (−x direction). It may be understood that the width of the first load matching area LMA1 in the first direction gradually increases in the second direction and then decreases. Alternatively, the first load matching area LMA1 may have a crescent shape.

The second load matching area LMA2 may have a convex shape in the first direction (+x direction). It may be understood that the width of the second load matching area LMA2 in the first direction gradually increases in the second direction and then decreases. Alternatively, the second load matching area LMA2 may have a crescent shape.

However, according to some example embodiments of the present disclosure, the shapes of the first and second load matching areas LMA1 and LMA2 are not limited thereto. The first and second load matching areas LMA1 and LMA2 may have various shapes such as a polygonal shape, a circular shape, and an elliptical shape.

The dummy area DMA may be positioned between the first region R1 and the second region R2. The dummy area DMA may be positioned between the first load matching area LMA1 and the second load matching area LMA2 and be spaced apart from the first load matching area LMA1 and the second load matching area LMA2.

The first and second data lines DLa and DLb traversing the first non-display area NDA1 may extend in the second direction to traverse the first and second load matching areas LMA1 and LMA2 and the dummy area DMA. That is, the first and second data lines DLa and DLb may at least partially overlap the first and second load matching areas LMA1 and LMA2 and/or the dummy area DMA.

Referring to FIGS. 7 and 8, the first and second load matching areas LMA1 and LMA2 include a plurality of load units LU. Each of the load units LU may include a load semiconductor layer L10, a first load conductive layer L20, and a second load conductive layer L30, which at least partially overlap each other with insulating layers 112, 113, and 115 therebetween.

Because the load semiconductor layer L10, the first load conductive layer L20 and the second load conductive layer L30 in the load unit LU at least partially overlap each other, a capacitance may be formed and serve as a load.

The first load conductive layer L20 may extend in the first direction. The first load conductive layer L20 may be positioned on the same layer as the first scan line SLa and may be formed integrally with the first scan line SLa. However, the present disclosure is not limited thereto. The first load conductive layer L20 may be positioned on a different layer than the first scan line SLa and may be connected to the first scan line SLa through a contact hole.

According to some example embodiments, a width W1 of the first load conductive layer L20 may be greater than a width Ws of the first scan line SLa. The width W1 of the first load conductive layer L20 may be variously changed depending on the size of the load.

The second load conductive layer L30 may extend in the second direction. The second load conductive layer L30 may be formed integrally with a driving voltage line for transferring a driving voltage to the pixels P. That is, the second load conductive layer L30 may receive the driving voltage. The second load conductive layer L30 may be connected to the load semiconductor layer L10 through a first contact hole CNT1. Accordingly, the load semiconductor layer L10 may have the same voltage level as the second load conductive layer L30. The load semiconductor layer L10 may have an island shape in the first non-display area NDA1.

The first load conductive layer L20 of the load unit LU may be electrically connected to the first scan line SLa, and the second load conductive layer L30 and the load semiconductor layer L10 may be electrically connected to the drive voltage line.

The dummy area DMA includes a plurality of dummy units DU. Each of the dummy units DU includes a dummy semiconductor layer D10, a first dummy conductive layer D20 and a second dummy conductive layer D30, which at least partially overlap each other with the insulating layers 112, 113, and 115 therebetween.

The dummy unit DU may be positioned in an area where the load unit LU is not positioned in the first non-display area NDA1. The dummy units DU may be provided to adjust pattern density to reduce process defects. Accordingly, the dummy units DU may be positioned apart from the load units LU. That is, the first dummy conductive layer D20 may extend in the first direction, and the end of the first dummy conductive layer D20 may be spaced apart from the end of the first load conductive layer L20.

The second dummy conductive layer D30 may extend in the second direction. The second dummy conductive layer D30 may be formed integrally with the driving voltage line for transferring the driving voltage to the pixels P. That is, the second dummy conductive layer D30 may receive a driving voltage. The second dummy conductive layer D30 may be connected to the dummy semiconductor layer D10 through a second contact hole CNT2. Also, the second dummy conductive layer D30 may be connected to the first dummy conductive layer D20 through a third contact hole CNT3.

Accordingly, the dummy semiconductor layer D10 and the first dummy conductive layer D20 may have the same voltage level as the second dummy conductive layer D30. The dummy semiconductor layer D10 and the first dummy conductive layer D20 may have island shapes in the first non-display area NDA1. Damage due to electrostatic discharge may be reduced as the dummy semiconductor layer D10 and the first dummy conductive layer D20 receive a voltage.

The first and second data lines DL1 and DL2 may be arranged in the first and second load matching areas LMA1 and LMA2 and the dummy area DMA. The data lines DL1 and DL2 may overlap the load unit LU and/or the dummy unit DU. For example, the data lines DL1 and DL2 may overlap the first load conductive layer L20 of the load unit LU. The data lines DL1 and DL2 may not overlap the load semiconductor layer L10 and the second load conductive layer L30 of the load unit LU. In some embodiments, the first data line DL1 may be positioned apart from the same layer as the second load conductive layer L30. The second data line DL2 may be positioned on a different layer than the first data line DL1. The first data line DL1 and the second data line DL2, which are arranged in different layers, may be alternately arranged to reduce an interval between the data lines DL1 and DL2.

The structures of the pixel P, the load unit LU, and the dummy unit DU will now be described in a stacking order with reference to FIG. 8.

The substrate 100 may include a glass material, a metal material, or a material that is flexible or bendable. When the substrate 100 is flexible or bendable, the substrate 100 may include a polymer resin, such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may have a structure of a single layer or multiple layers of any of the aforementioned materials. The multi-layered structure may further include an inorganic layer. In some embodiments, the substrate 100 may have a structure of organic material/inorganic material/organic material.

A buffer layer 111 may be positioned on the substrate 100 and may reduce or prevent infiltration of a foreign material, moisture, or ambient air from below the substrate 100 and may provide a flat surface on the substrate 100. The buffer layer 111 may include an inorganic material (such as oxide or nitride), an organic material, or an organic and inorganic complex, and may be formed as a single layer or multiple layers of an inorganic material and an organic material.

According to some example embodiments, a barrier layer may be further included between the substrate 100 and the buffer layer 111. The barrier layer may prevent or reduce infiltration of impurities from the substrate 100 and the like into semiconductor layers, i.e. a semiconductor layer A of a thin-film transistor TFT, the load semiconductor layer L10, and the dummy semiconductor layer D10. The barrier layer may include an inorganic material (such as oxide or nitride), an organic material, or an organic and inorganic complex, and may be formed as a single layer or multiple layers of an inorganic material and an organic material.

The semiconductor layer A of the thin-film transistor TFT, the load semiconductor layer L10, and the dummy semiconductor layer D10 may be arranged on the buffer layer 111. The semiconductor layer A, the load semiconductor layer L10, and the dummy semiconductor layer D10 may include amorphous silicon or polysilicon. According to some example embodiments, the semiconductor layer A, the load semiconductor layer L10, and the dummy semiconductor layer D10 may include oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). According to some example embodiments, the semiconductor layer A, the load semiconductor layer L10, and the dummy semiconductor layer D10 may include Zn oxide, In—Zn oxide, Ga—In—Zn oxide, or the like as a Zn oxide-based material. In other embodiments, the semiconductor layer A, the load semiconductor layer L10, and the dummy semiconductor layer D10 may be an In—Ga—Zn—O (IGZO), In—Sn—Zn—O (ITZO), or In—Ga—Sn—Zn—O (IGTZO) semiconductor containing a metal, such as In, Ga, or Sn, in ZnO. The semiconductor layer A, the load semiconductor layer L10, and the dummy semiconductor layer D10 may include a channel region, and a source region and a drain region respectively arranged on both sides of the channel region. Each of the semiconductor layer A, the load semiconductor layer L10, and the dummy semiconductor layer D10 may be formed as a single layer or multiple layers.

A gate electrode G is positioned on the semiconductor layer A of the thin-film transistor TFT with the first gate insulating layer 112 therebetween, such that the gate electrode G at least partially overlaps the semiconductor layer A. The gate electrode G may include, for example, molybdenum (Mo), aluminum (Al), copper (Cu), or titanium (Ti), and may include a single layer or multiple layers. For example, the gate electrode G may include a single layer of Mo.

The first load conductive layer L20 may be on the first gate insulating layer 112 to at least partially overlap the load semiconductor layer L10. The first load conductive layer L20 may be formed on the same layer as the gate electrode G and include the same material as the gate electrode G.

The first dummy conductive layer D20 may be on the first gate insulating layer 112 to at least partially overlap the dummy semiconductor layer D10. The first dummy conductive layer D20 may be formed in the same layer as the gate electrode G and include the same material as the gate electrode G.

The first gate insulating layer 112 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The second gate insulating layer 113 may be included such that the second gate insulating layer 113 covers the gate electrodes G, the first load conductive layer L20, and the first dummy conductive layer D20. The second gate insulating layer 113 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A first storage capacitor plate CE1 of a storage capacitor Cst may overlap the thin-film transistor TFT. For example, the gate electrode G of the thin-film transistor TFT may function as the first storage capacitor plate CE1 of the storage capacitor Cst.

A second storage capacitor plate CE2 of the storage capacitor Cst overlaps the first storage capacitor plate CE1 with the second gate insulating layer 113 therebetween. In this case, the second gate insulating layer 113 may function as a dielectric layer of the storage capacitor Cst. The second storage capacitor plate CE2 may include a conductive material including molybdenum (Mo), aluminum (Al), copper (Cu), and titanium (Ti), and may be formed as a multi-layer or single layer including the aforementioned materials. For example, the second storage capacitor plate CE2 may include a single layer of Mo or a multi-layer of Mo/Al/Mo.

Although the storage capacitor Cst overlaps the thin-film transistor TFT in the drawings, the present disclosure is not limited thereto. The storage capacitors Cst may not overlap the thin-film transistor TFT. In this way, various modifications may be made.

The interlayer insulating layer 115 may be included to cover the second storage capacitor plate CE2 of the storage capacitor Cst. The interlayer insulating layer 115 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A source electrode S and a drain electrode D of the thin-film transistor TFT may be arranged on the interlayer insulating layer 115. Each of the source electrode S and the drain electrode D may include a conductive material including Mo, Al, Cu, and Ti, and may be a multi-layer or single layer including the aforementioned materials. For example, each of the source electrode S and the drain electrode D may be a multi-layer of Ti/Al/Ti.

The second load conductive layer L30, the second dummy conductive layer D30, and the first data line DL1 may be arranged on the interlayer insulating layer 115. The second load conductive layer L30 on the interlayer insulating layer 115 may at least partially overlap the load semiconductor layer L10 and the first load conductive layer L20. The second load conductive layer L30 may be electrically connected to the load semiconductor layer L10 through the first contact hole CNT1 penetrating the interlayer insulating layer 115, the second gate insulating layer 113 and the first gate insulating layer 112.

The second dummy conductive layer D30 on the interlayer insulating layer 115 may at least partially overlap the dummy semiconductor layer D10 and the first dummy conductive layer D20. The second dummy conductive layer D30 may be electrically connected to the dummy semiconductor layer D30 through the second contact hole CNT2 penetrating the interlayer insulating layer 115, the second gate insulating layer 113 and the first gate insulating layer 112. Also, the second dummy conductive layer D30 may be connected to the first dummy conductive layer D20 through the third contact hole CNT3 penetrating the interlayer insulating layer 115 and the second gate insulating layer 113.

The first data line DL1 is a wiring for transferring a data signal to the pixel P and may be positioned apart from the second load conductive layer L30 and the second dummy conductive layer D30.

A via layer 117 and an additional via layer 118 may be positioned on the source electrode S, the drain electrode D, the second load conductive layer L30, the second dummy conductive layer D30, and the first data line DL1, and an organic light-emitting diode OLED may be positioned in a region of the pixel P on the additional via layer 118. According to some example embodiments, the additional via layer 118 may be omitted.

The via layer 117 and the additional via layer 118 may have flat upper surfaces such that a pixel electrode 310 may be formed flat. The via layer 117 and the additional via layer 118 may each be formed as a single layer including an organic material or as multiple layers each including an organic material. The via layer 117 and the additional via layer 118 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The via layer 117 and the additional via layer 118 may include an inorganic material. The via layer 117 and the additional via layer 118 may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. When the via layer 117 and the additional via layer 118 include an inorganic material, chemical planarization polishing may be conducted. The via layer 117 may include both an organic material and an inorganic material.

The second data line DL2 may be positioned between the via layer 117 and the additional via layer 118. The second data line DL2 is a wiring for transferring a data signal to the pixel P and may alternate with the first data line DL1 in a region detouring around the first region R1 and the second region R2.

In the display area DA of the substrate 100, the organic light-emitting diode OLED is positioned on the additional via layer 118. The organic light-emitting diode OLED includes the pixel electrode 310, an opposite electrode 330, and an intermediate layer 320 including an organic emission layer.

A via hole via which one of the source electrode S and the drain electrode D of the thin-film transistor TFT is exposed is formed in the via layer 117 and the additional via layer 118, and the pixel electrode 310 contacts the source electrode S or the drain electrode D via the via hole and is electrically connected to the thin-film transistor TFT.

The pixel electrode 310 may be a (semi) light-transmissive electrode or a reflective electrode. According to some example embodiments, the pixel electrode 310 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof, and a transparent or semi-transparent electrode layer formed on the reflection layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to some example embodiments, the pixel electrode 310 may have a stack structure of ITO/Ag/ITO.

A pixel defining layer 119 may be positioned on the additional via layer 118. The pixel defining layer 119 may define light-emission regions of pixels P by including openings respectively corresponding to the pixel electrodes 310, namely, openings OP via which at least center portions of the pixel electrodes 310 are exposed, in the display area DA. The pixel defining layer 119 may prevent or reduce instances of an arc or the like occurring on the edges of the pixel electrodes 310 by increasing distances between the edges of the pixel electrodes 310 and the opposite electrodes 330 positioned on the pixel electrodes 310. The pixel defining layer 119 may be formed of an organic insulating material, such as polyimide, polyamide, acryl resin, benzocyclobutene, hexamethyldisiloxane (HMDSO), or phenol resin, via spin coating or the like.

The pixels P, namely, the light-emission regions of the pixels P, may be defined by the openings OP of the pixel defining layer 119. In other words, the edges of the pixels P may mean edges of the openings OP of the pixel defining layer 119. The edges of the openings OP of the pixel defining layer 119 may mean boundaries of the pixel electrodes 310 that are exposed via the openings OP.

The intermediate layer 320 of the organic light-emitting diode OLED may include an organic emission layer 321, and a first common layer 322 and a second common layer 323 that may be respectively positioned on the bottom and top of the organic emission layer 321.

The organic emission layer 321 may include an organic material including a fluorescent or phosphorescent material that emits red, green, blue, or white light. The organic emission layer 321 may include a low-molecular weight organic material or a high-molecular weight organic material.

The first common layer 322 may include a hole injection layer (HIL) and/or a hole transport layer (HTL), and the second common layer 323 may include an electron transport layer (ETL) and/or an electron injection layer (EIL).

The intermediate layer 320 may be arranged to correspond to each of a plurality of pixel electrodes 310. However, the disclosure is not limited thereto. The intermediate layer 320 may include a single layer extending over the plurality of pixel electrodes 310, namely, the first common layer 322 and/or the second common layer 323. In this way, various modifications may be made. The first common layer 322 and/or the second common layer 323 may be omitted.

The opposite electrode 330 may include a light-transmissive electrode or a reflective electrode. According to some example embodiments, the opposite electrode 330 may include a transparent or semi-transparent electrode, and may include a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), or a compound thereof. A transparent conductive oxide (TCO) layer including TCO, such as indium tin oxide (ITO), indium zinc oxide (IZO), zinc oxide (ZnO), or indium oxide ($In_2O_3$), may be further positioned on the metal thin film. The opposite electrode 330 may extend over both the display area DA and the non-display area NDA and may be arranged on the intermediate layer 320 and the pixel defining layer 119. The opposite electrode 330 may be formed as a single body constituting a plurality of organic light-emitting diodes OLED, and thus may correspond to the plurality of pixel electrodes 310.

When the pixel electrode 310 includes a reflective electrode and the opposite electrode 330 includes a light-transmissive electrode, light emitted by the intermediate layer 320 is emitted toward the opposite electrode 330, and accordingly the display device 1 may be of a top-emission type. When the pixel electrode 310 includes a transparent or semi-transparent electrode and the opposite electrode 330 includes a reflective electrode, light emitted by the intermediate layer 320 is emitted toward the substrate 100, and accordingly the display device 1 may be of a bottom-emission type. However, embodiments are not limited thereto. The display device 1 according to some example embodiments may be of a dual emission type that emits light in both directions, namely, toward the top surface and the bottom surface of the display device 1.

A capping layer 340 may be arranged on the opposite electrode 330. The capping layer 340 may have a different (lower or higher) refractive index than the opposite electrode 330 and may improve luminescent efficiency by increasing a percentage that light generated by the intermediate layer 320 including the organic emission layer 321 is totally reflected and is emitted to the outside.

For example, the capping layer 340 may include an organic material, such as poly(3,4-ethylenedioxythiophene) (or PEDOT), 4,4'-bis[N-(3-methylphenyl)-N-phenylamino] biphenyl (TPD), 4,4',4''-tris[(3-methylphenyl) phenylamino] triphenylamine (m-MTDATA), 1,3,5-tris[N,N-bis(2-methylphenyl)-amino]-benzene (o-MTDAB), 1,3,5-tris[N,N-bis (3-methylphenyl)-amino]-benzene (m-MTDAT), 1,3,5-tris [N,N-bis(4-methylphenyl)-amino]-benzene (p-MTDAB), 4,4'-bis[N,N-bis(3-methylphenyl)-amino]-diphenylmethane (BPPM), 4,4'-dicarbazolyl-1,1'-biphenyl (CBP), 4,4',4''-tris (N-carbazole)triphenylamine (TCTA), 2,2',2''-(1,3,5-benzenetolyl) tris-[1-phenyl-1H-benzoimidazole] (TPBI), and 3-(4-biphenyl)-4-phenyl-5-t-butylphenyl-1,2,4-triazole (TAZ).

Alternatively, the capping layer 340 may include an inorganic material, such as zinc oxide, titanium oxide, zirconium oxide, silicon nitride, niobium oxide, tantalum oxide, tin oxide, nickel oxide, indium nitride, and gallium nitride. The materials used to form the capping layer 340 are not limited thereto, and various other materials may be used.

According to some example embodiments, a cover layer may be arranged on the capping layer 340. The cover layer protects the organic light-emitting diode OLED against damage that may occur during a subsequent process using plasma or the like. The cover layer may include LiF.

Figure 9:
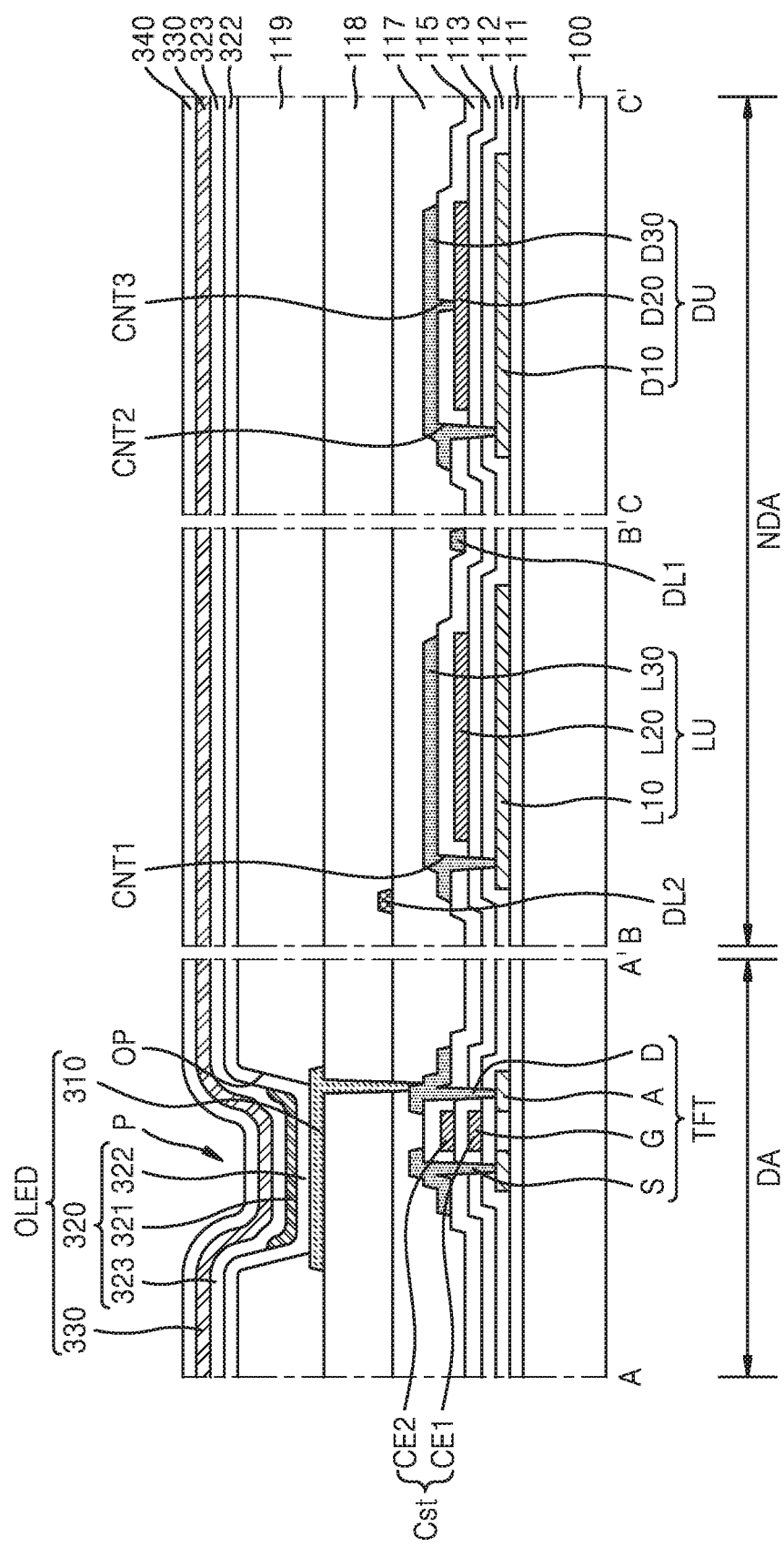
FIG. 9 is a cross-sectional view of a portion of a display panel according to some example embodiments.

FIG. 9 is a cross-sectional view of a portion of a display panel according to some example embodiments. In FIG. 9, the same reference numerals as those in FIG. 8 denote the same members, and thus, repeated descriptions thereof will be omitted.

Referring to FIG. 9, a load unit LU includes a load semiconductor layer L10, a first load conductive layer L20, and a second load conductive layer L30, which at least partially overlap each other with insulating layers, i.e., first to third gate insulating layers 112, 113, and 115, and the load semiconductor layer L10 is connected to the second load conductive layer L30 via a first contact hole CNT1.

A dummy unit DU includes a dummy semiconductor layer D10, a first dummy conductive layer D20, and a second dummy conductive layer D30, which at least partially overlap each other with the first to third insulating layers 112, 113, and 115, and the dummy semiconductor layer D10 and the first dummy conductive layer D20 are electrically connected to the second dummy conductive layer D30 via a second contact hole CNT2 and a third contact hole CNT3, respectively.

According to some example embodiments, the first load conductive layer L20 and/or the first dummy conductive layer D20 may be positioned on the second gate insulating layer 113. That is, the first load conductive layer L20 and/or the first dummy conductive layer D20 may be formed in the same layer as the second storage capacitor plate CE2 and include the same material as the second storage capacitor plate CE2. Accordingly, the first gate insulating layer 112 and the second gate insulating layer 113 are positioned between the first load conductive layer L20 and the load semiconductor layer L10, and thus, the distance between the first load conductive layer L20 and the load semiconductor layer L10 may increase and thus damage caused by an electrostatic discharge may be reduced.

Figure 10:
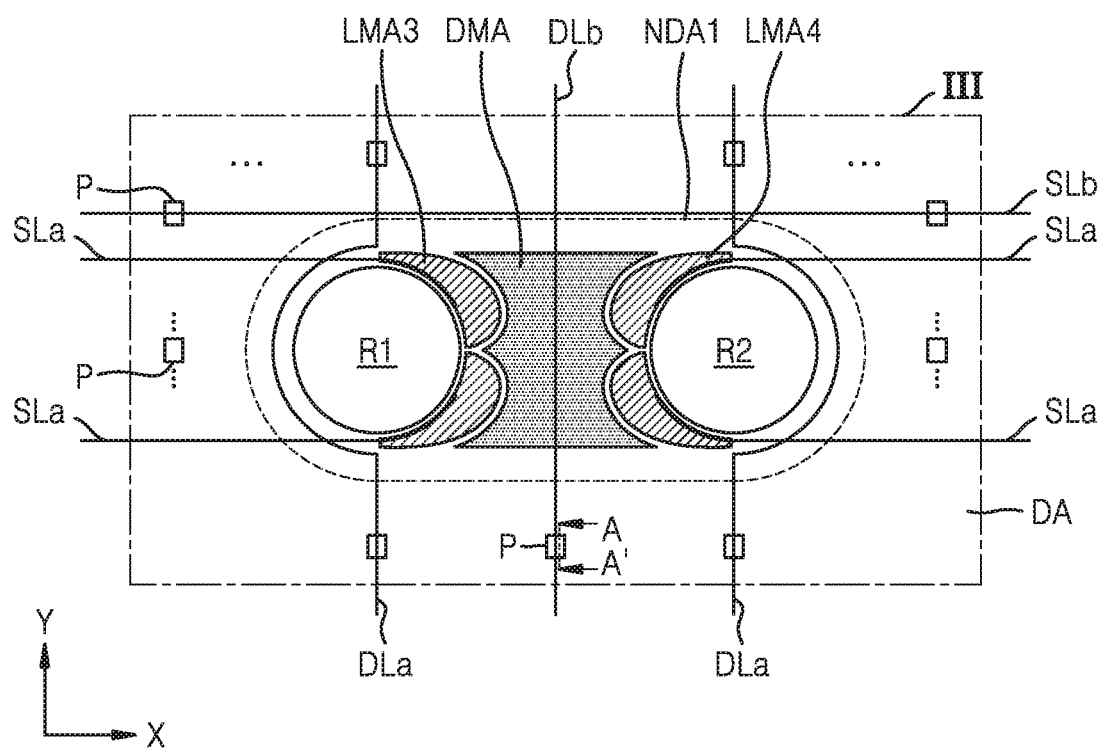
FIG. 10 is a plan view of a portion of a display panel according to some example embodiments.

FIG. 10 is a plan view of a portion of a display panel according to some example embodiments. In FIG. 10, the same reference numerals as those in FIG. 6 denote the same members, and thus, repeated descriptions thereof will be omitted.

Referring to FIG. 10, a first region R1 and a second region R2 are arranged in the first direction, and a first non-display area NDA1 surrounds the first region R1 and the second region R2 and a display area DA surrounds the first non-display area NDA1.

A plurality of pixels P may be arranged in the display area DA, and a third load matching area LMA3, a fourth load matching area LMA4 and a dummy area DMA may be arranged in the first non-display area NDA1.

According to some example embodiments, the third load matching area LMA3 and the fourth load matching area LMA4 may be arranged between the first region R1 and the second region R2. That is, the third load matching area LMA3 may be positioned on the right side of the first region R1 and the fourth load matching area LMA4 may be positioned on the left side of the second region R2.

The positions of the third and fourth load matching areas LMA3 and LMA4 may be set in consideration of the size of a dead space area. For example, when a large number of load units LU included in the third and fourth load matching areas LMA3 and LMA4 are required, a space of a non-display area on the left side of the first region R1 may be insufficient. Accordingly, the third and fourth load matching areas LMA3 and LMA4 may be set between the first region R1 and the second region R2 to efficiently utilize a space in the first non-display area NDA1.

When the third and fourth load matching areas LMA3 and LMA4 are set between the first region R1 and the second region R2, first scan lines SLa connected to the load units LU of the third and fourth load matching areas LMA3 and LMA4 may detour around the first region R1 or the second region R2.

Some of the first scan lines SLa may detour around an upper portion of the first region R1 and the remainder may detour around a lower portion of the first region R1. Accordingly, the third load matching area LMA3 may be divided into an upper load area LMA3-1 and a lower load area LMA3-2.

According to some example embodiments, the widths of the upper load area LMA3-1 and the lower load area LMA3-2 in the first direction may gradually increase in the second direction and then decrease. Likewise, the fourth load matching area LMA4 may be divided into an upper load area LMA4-1 and a lower load area LMA4-2.

The dummy area DMA may be between the third load matching area LMA3 and the fourth load matching area LMA4 and be positioned apart from the third load matching area LMA3 and the fourth load matching area LMA4.

Data lines DLa and DLb extending in the second direction may be arranged to overlap the third load matching area LMA3, the fourth load matching area LMA4, and the dummy area DMA.

The load unit LU included in each of the third load matching area LMA3 and the fourth load matching area LMA4 may have the structure of the load unit LU described with reference to FIGS. 7 to 9. The dummy unit DU included in the dummy area DMA may have the structure of the dummy unit DU described with reference to FIGS. 7 to 9.

Figure 11:
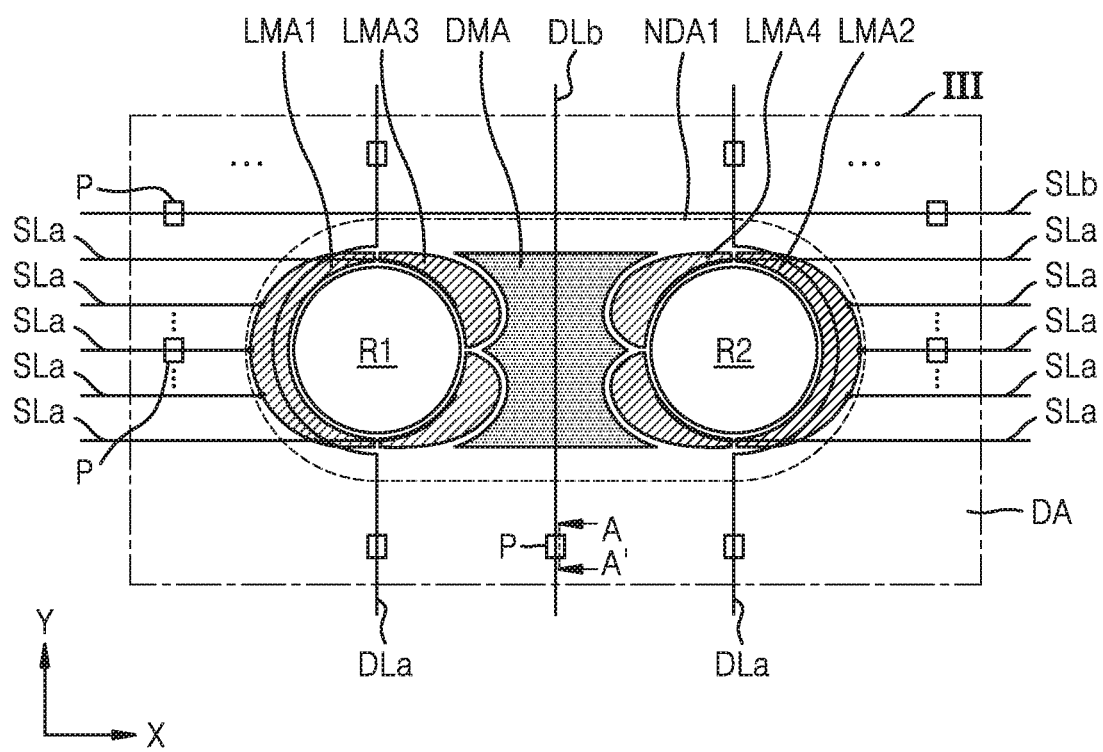
FIG. 11 is a plan view of a portion of a display panel according to some example embodiments.

FIG. 11 is a plan view of a portion of a display panel according to some example embodiments. In FIG. 11, the same reference numerals as those in FIGS. 6 and 10 denote the same members, and thus, some repeated descriptions thereof will be omitted.

Referring to FIG. 11, a first region R1 and a second region R2 are arranged in the first direction, and a first non-display area NDA1 surrounds the first region R1 and the second region R2 and a display area DA surrounds the first non-display area NDA1.

A plurality of pixels P may be arranged in the display area DA, and first to fourth load matching areas LMA1 to LMA4 and a dummy area DMA may be arranged in the first non-display area NDA1.

The first load matching area LMA1 may be positioned on the left side of the first region R1 and the second load matching area LMA2 may be positioned on the right side of the second region R2. The third load matching area LMA3 and the fourth load matching area LMA4 may be arranged between the first region R1 and the second region R2. That is, the third load matching area LMA3 may be positioned on the right side of the first region R1 and the fourth load matching area LMA4 may be positioned on the left side of the second region R2.

As the first to fourth load matching areas LMA1 to LMA4 are arranged on the left and right sides of the first region R1 and the second region R2, some of first scan lines SLa connected to the first to fourth load matching areas LMA1 to LMA4 may detour around the first region R1 or the second region R1 and the remainder may not detour around the first region R1 or the second region R1.

The positions of the first to fourth load matching areas LMA1 to LMA4 may be set in consideration of the size of a dead space area. That is, some of the first scan lines SLa may be connected to the first load matching area LMA1 on the left side of the first region R1 and some of the first scan lines SLa may be connected to the third load matching area LMA3 on the right side of the first region R1, and thus, the first to fourth load matching areas LMA1 to LMA4 may be efficiently distributed in the first non-display area NDA1.

According to some example embodiments, the case where two transmission areas are provided has been described as an example. However, the present disclosure is not limited thereto. The present disclosure may also be applied to the case where three or four or more transmission areas are provided.

Figure 12:
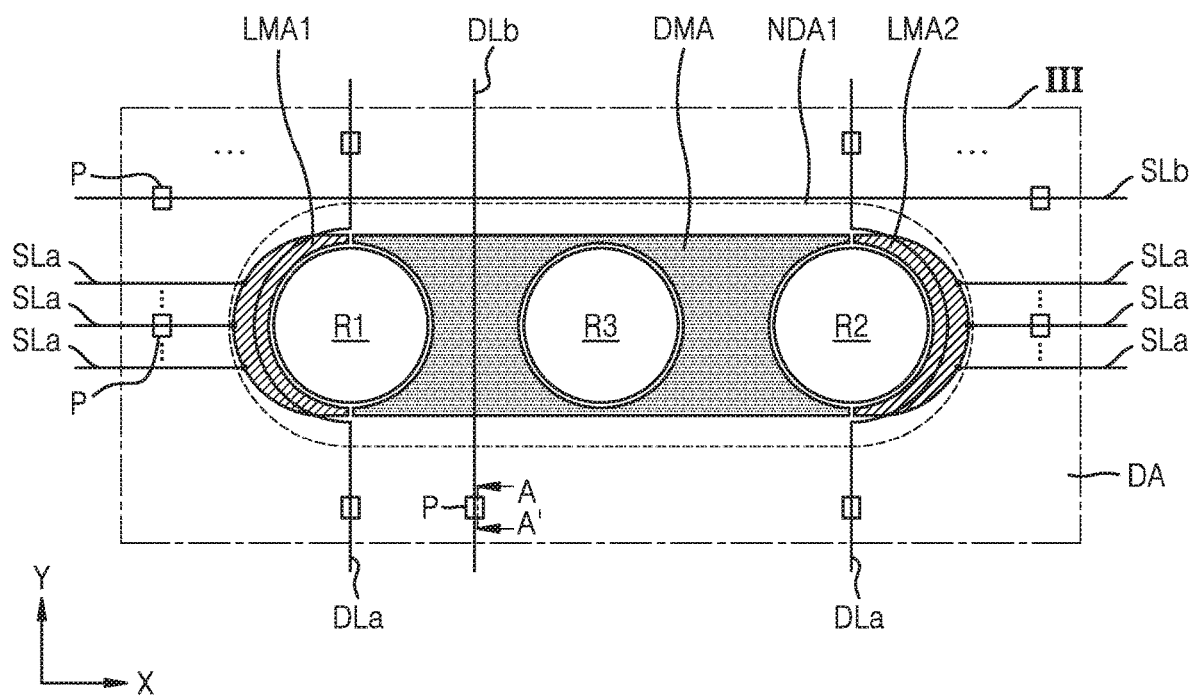
FIG. 12 is a plan view of a portion of a display panel according to some example embodiments.
Figure 13:
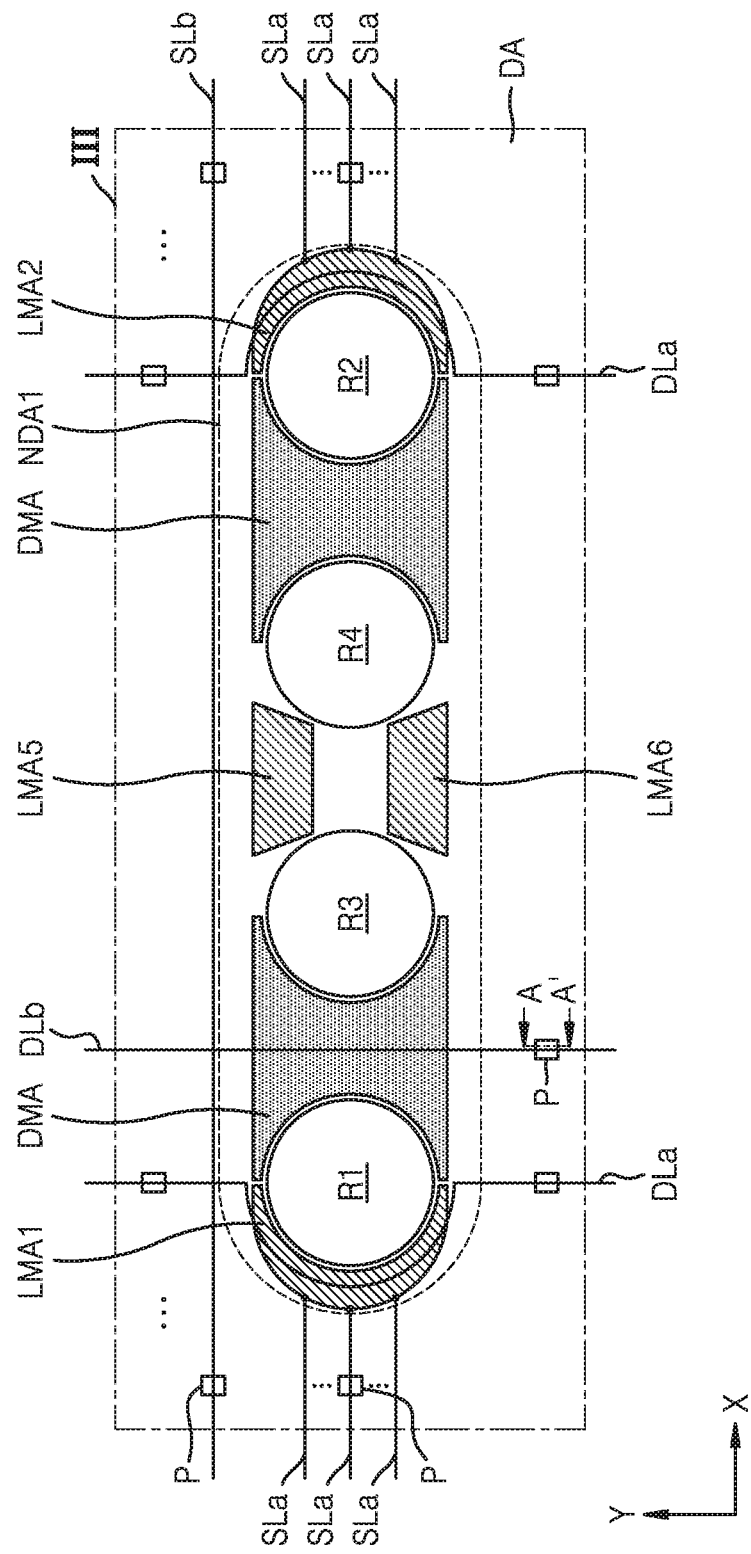
FIG. 13 is a plan view of a portion of a display panel according to some example embodiments.

As shown in FIG. 12, a third region R3, which is a transmission area, may be positioned between a first region R1 and a second region R2. That is, the first region R1, the third region R3, and the second region R2 may be arranged side by side in the first direction. Alternatively, as shown in FIG. 13, a third region R3 and a fourth region R4, which are transmission areas, may be arranged between a first region R1 and a second region R2. That is, the first region R1, the third region R3, the fourth region R4, and the second region R2 may be arranged side by side in the first direction.

First scan lines SLa of first and second scan lines SLa and SLb extending in the first direction may be cut on the left side of the first region R1 and the right side of the second region R2. The first scan lines SLa may be connected to load units of the first and second load matching areas LMA1 and LMA2.

A dummy area DMA may be positioned in a first non-display area NDA1 where the first and second load matching areas LMA1 and LMA2 are not arranged, and may be spaced apart from the first and second load matching areas LMA1 and LMA2.

Data lines DLa and DLb extending in the second direction may be arranged to overlap the first and second load matching areas LMA1 and LMA2 or the dummy area DMA.

The positions of the first and second load matching areas LMA1 and LMA2 may be variously modified. The first and second load matching areas LMA1 and LMA2 may be arranged corresponding to upper or lower portions of the first to fourth regions R1 to 4. For example, as shown in FIG. 13, fifth and sixth load matching areas LMA5 and LMA6 may be arranged at upper and lower portions of the middle of the first non-display area.

According to some example embodiments, a load matching area is positioned near areas corresponding to electronic elements such as a sensor and a camera, thereby providing a display panel in which luminance deviation due to a difference in load is reduced. In addition, a dummy area is positioned between load matching areas, and thus, pattern density may be made uniform and a high-quality display panel may be provided.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
   a substrate including:
      a first region;
      a second region spaced apart from the first region along a first direction;
      a non-display area surrounding the first region and the second region; and
      a display area surrounding the non-display area;
   a plurality of pixels in the display area;
   a plurality of wirings configured to supply signals to the plurality of pixels; and
   load units in load matching areas, at least one of the load units being coupled to a first wiring from among the wirings,
   wherein a load matching area from among the load matching areas is in the non-display area; and
   wherein the at least one of the load units comprises a first layer, a second layer, and a third layer, and the first layer is connected to the third layer.

2. The display panel of claim 1, wherein the first layer comprises a semiconductor.

3. The display panel of claim 1, wherein the second layer and the third layer comprise a conductive material.

4. The display panel of claim 1, wherein the first layer, the second layer, and the third layer overlap each other at least partially with an insulating layer therebetween.

5. The display panel of claim 1, wherein the first wiring extends to the non-display area and is connected to the second layer.

6. The display panel of claim 1, wherein a dummy area includes a plurality of dummy units spaced from the load units in the non-display area.

7. The display panel of claim 6, wherein at least one of the dummy units comprises:
   a dummy semiconductor layer;
   a first dummy conductive layer; and
   a second dummy conductive layer, which at least partially overlap each other with an insulating layer therebetween, wherein the dummy semiconductor layer and the first dummy conductive layer are connected to the second dummy conductive layer via a second contact hole and a third contact hole, respectively.

8. The display panel of claim 6, wherein the dummy area is between the first region and the second region.

9. The display panel of claim 1, wherein the first region and the second region are arranged from left to right in the first direction, wherein the load matching area comprises a first load matching area on a left side of the first region and a second load matching area on a right side of the second region.

10. The display panel of claim 9, wherein the first load matching area has a convex shape in a direction opposite to the first direction.

11. The display panel of claim 9, wherein the load matching area further comprises a third load matching area on a right side of the first region and a fourth load matching area on a left side of the second region.

12. The display panel of claim 11, wherein the third load matching area comprises an upper area and a lower area arranged in a second direction perpendicular to the first direction, and widths of the upper area and the lower area in the first direction gradually increases in the second direction and then decreases.

13. The display panel of claim 11, wherein load units of the first load matching area are connected to load units of the third load matching area through wirings that detour around the first region.

14. The display panel of claim 1, wherein the first region and the second region are arranged from left to right in the first direction, wherein the load matching area comprises a third load matching area on a right side of the first region and a fourth load matching area on a left side of the second region.

15. The display panel of claim 14, wherein the first wiring connected to the third load matching area detours around the first region.

16. The display panel of claim 1, further comprising a plurality of data lines connected to the plurality of pixels,
wherein the first wiring extends in the first direction and the data lines extend in a second direction intersecting with the first direction, and
wherein the load units overlap some of the data lines.

17. The display panel of claim 16, wherein the third layer is at a same layer as the data lines and is spaced from the data lines.

18. The display panel of claim 16, wherein the second layer overlaps at least some of the data lines.

19. The display panel of claim 16, wherein the data lines comprise first data lines and second data lines at different layers,
wherein the second data lines alternate with the first data lines in a region around the first region and the second region.

20. The display panel of claim 1, further comprising:
a third region between the first region and the second region,
wherein the first region, the third region, and the second region are arranged from left to right in the first direction,
wherein the load matching area comprises a first load matching area on a left side of the first region and a second load matching area on a right side of the second region.

21. The display panel of claim 1, wherein the load matching area is arranged between the first region and the display area along the first direction.

22. The display panel of claim 1, wherein the load matching area is arranged between the first region and the second region.

* * * * *